(12) United States Patent
Yamazaki et al.

(10) Patent No.: US 6,448,118 B2
(45) Date of Patent: *Sep. 10, 2002

(54) SEMICONDUCTOR FILM MANUFACTURING WITH SELECTIVE INTRODUCTION OF CRYSTALLIZATION PROMOTING MATERIAL

(75) Inventors: Shunpei Yamazaki, Tokyo; Hisashi Ohtani; Hideto Ohnuma, both of Kanagawa, all of (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/749,863

(22) Filed: Dec. 26, 2000

Related U.S. Application Data

(63) Continuation of application No. 09/028,963, filed on Feb. 23, 1998, now Pat. No. 6,197,626.

(30) Foreign Application Priority Data

Feb. 26, 1997 (JP) .............................................. 9-058317

(51) Int. Cl.⁷ .......................... H01L 21/00; H01L 21/26
(52) U.S. Cl. ........................................ 438/166; 257/347
(58) Field of Search ................................ 438/143, 149, 438/151, 158, 161, 166, 162

(56) References Cited

U.S. PATENT DOCUMENTS

| | | |
|---|---|---|
| 4,561,171 A | 12/1985 | Schlosser |
| 5,244,819 A | 9/1993 | Yue |
| 5,275,851 A | 1/1994 | Fonash et al. |
| 5,360,748 A | 11/1994 | Nadahara et al. |
| 5,403,772 A | 4/1995 | Zhang et al. |
| 5,501,989 A | 3/1996 | Takayama et al. |
| 5,529,937 A | 6/1996 | Zhang et al. |

(List continued on next page.)

FOREIGN PATENT DOCUMENTS

| | | |
|---|---|---|
| EP | 0 612 102 A2 | 8/1994 |
| JP | 05-109737 | 4/1993 |
| JP | 06-244103 | 9/1994 |
| JP | 06-244104 | 9/1994 |
| JP | 06-259117 | 9/1994 |
| JP | 6-333824 | 12/1994 |
| JP | 06-333825 | 12/1994 |
| JP | 07-130652 | 5/1995 |
| JP | 07-335548 | 12/1995 |
| JP | 07-335906 | 12/1995 |
| JP | 09-045616 | 2/1997 |

*Primary Examiner*—Long Pham
*Assistant Examiner*—William David Coleman
(74) *Attorney, Agent, or Firm*—Fish & Richardson P.C.

(57) ABSTRACT

A TFT having stable characteristics is obtained by using a crystal silicon film obtained by crystallizing an amorphous silicon film by using nickel. Phosphorus ions are implanted to regions 111 and 112 by using a mask 109. Then, a heat treatment is performed to getter nickel existing in a region 113 to the regions 111 and 112. Then, the mask 109 is side-etched to obtain a pattern 115. Then, the regions 111 and 112 are removed by utilizing the pattern 115 and to pattern the region 113. Thus, a region 116 from which nickel element has been removed is obtained. The TFT is fabricated by using the region 116 as an active layer.

57 Claims, 13 Drawing Sheets

U.S. PATENT DOCUMENTS

| | | | | |
|---|---|---|---|---|
| 5,608,232 | A | 3/1997 | Yamazaki et al. | |
| 5,639,698 | A | 6/1997 | Yamazaki et al. | |
| 5,643,826 | A | 7/1997 | Ohtani et al. | |
| 5,656,825 | A | 8/1997 | Kusumoto et al. | |
| 5,700,333 | A | 12/1997 | Yamazaki et al. | |
| 5,773,327 | A * | 6/1998 | Yamazaki et al. | 438/154 |
| 5,789,284 | A | 8/1998 | Yamazaki et al. | |
| 5,814,540 | A | 9/1998 | Takemura et al. | |
| 5,817,549 | A * | 10/1998 | Yamazaki et al. | 438/166 |
| 5,843,833 | A * | 12/1998 | Ohtani et al. | 438/486 |
| 5,854,096 | A * | 12/1998 | Ohtani et al. | 438/166 |
| 5,864,151 | A * | 1/1999 | Yamazaki et al. | 257/66 |
| 5,869,363 | A | 2/1999 | Yamazaki et al. | |
| 5,879,974 | A * | 3/1999 | Yamazaki | 438/162 |
| 5,879,977 | A * | 3/1999 | Zhang et al. | 438/166 |
| 5,888,857 | A * | 3/1999 | Zhang et al. | 438/162 |
| 5,888,858 | A | 3/1999 | Yamazaki et al. | |
| 5,897,347 | A | 4/1999 | Yamazaki et al. | |
| 5,915,174 | A | 6/1999 | Yamazaki et al. | |
| 5,923,962 | A | 7/1999 | Ohtani et al. | |
| 5,956,579 | A | 9/1999 | Yamazaki et al. | |
| 5,961,743 | A | 10/1999 | Yamazaki et al. | |
| 5,985,740 | A | 11/1999 | Yamazaki et al. | |
| 6,027,987 | A | 2/2000 | Yamazaki et al. | |
| 6,077,731 | A | 6/2000 | Yamazaki et al. | |
| 6,084,247 | A | 7/2000 | Yamazaki et al. | |
| 6,110,770 | A | 8/2000 | Zhang et al. | |
| 6,156,627 | A | 12/2000 | Zhang et al. | |
| 6,285,042 | B1 | 9/2001 | Ohtani et al. | |

* cited by examiner

IMPLANT PHOSPHORUS IONS

IMPLANT PHOSPHORUS IONS

HEAT TREATMENT

DOPE PHOSPHORUS

HEAT TREATMENT

IMPLANT PHOSPHORUS IONS

IMPLANT BORON IONS

PTFT                NTFT

HEAT TREATMENT

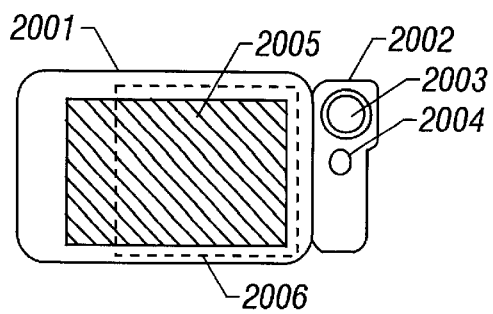
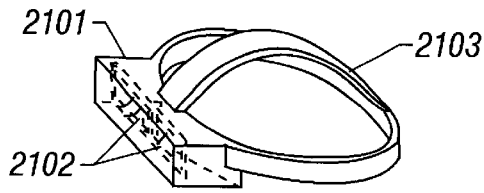
FIG. 12A                FIG. 12B
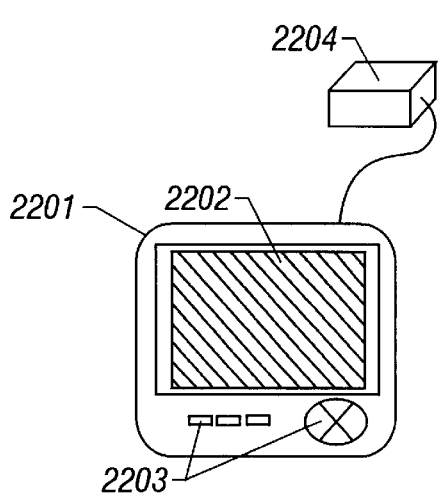
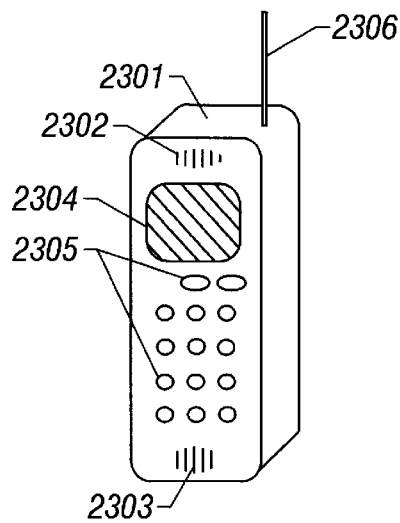
FIG. 12C                FIG. 12D
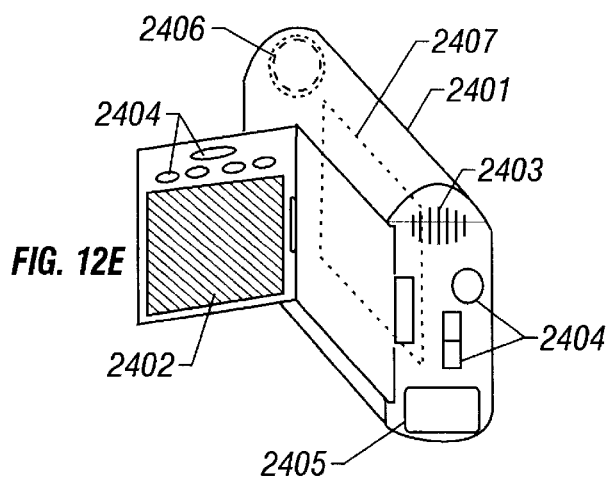
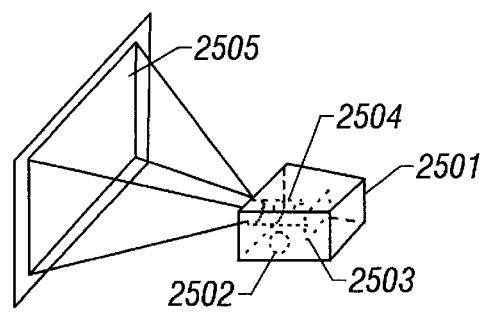
FIG. 12E                FIG. 12F

SEMICONDUCTOR FILM MANUFACTURING WITH SELECTIVE INTRODUCTION OF CRYSTALLIZATION PROMOTING MATERIAL

This application is a continuation of U.S. application Ser. No. 09/028,963, filed Feb. 23, 1998.

BACKGROUND OF THE INVENTION

1. Field of the Invention

The invention disclosed in this specification relates to a thin film transistor and a fabrication method thereof and more particularly to a circuit and a device constructed by using a thin film transistor.

2. Description of Related Art

Hitherto, there has been known a thin film transistor (hereinafter referred to as a TFT or the like) constructed by forming a thin film semiconductor or a silicon semiconductor film in particular on a substrate.

While such a TFT is used in various integrated circuits, it is often used in an active matrix type liquid crystal display in particular. The active matrix type liquid crystal display has a structure in which the TFT is disposed as a switching device in each pixel electrode arranged in a matrix. There has been also known a liquid crystal display in which not only the matrix circuit but also a peripheral driving circuit thereof is constructed by TFTs (which is called a peripheral driving circuit integrated display).

The TFT is also used in various integrated circuits and multi-layered integrated circuit (three-dimensional IC).

It is convenient to use an amorphous silicon film which is formed by means of chemical vapor deposition such as plasma CVD as a silicon film used in the TFT. It may be said that this technology has been almost established.

However, the TFT using the amorphous silicon film has an electrical characteristic which is far lower than that using a single crystal semiconductor used in general semiconductor integrated circuits. Therefore, it is the present situation that it is used only in the limited uses such as a switching device of the active matrix circuit.

As a technological trend of the future, it is required to realize an arrangement in which the active matrix circuit, the peripheral driving circuit, an image processing circuit, an oscillation circuit and the like are integrated on one and the same substrate.

A crystal silicon film may be used, instead of the amorphous silicon film, in order to improve the characteristic of the TFT using the amorphous silicon film. A silicon film having a crystallinity beside single crystal silicon is called poly-crystal silicon, poly-silicon, microcrystal silicon and the like.

Such a silicon film having the crystallinity may be obtained by forming the amorphous silicon film at first and then by crystallizing it by heating (annealing). This method is called solid phase growth because the amorphous state changes to the crystal state while keeping the solid state.

However, there has been a problem that the solid phase growth of silicon requires more than 600° C. of heating temperature and more than 20 hours of heating time and it is difficult to use a low cost glass substrate as a substrate.

For example, the Corning 7059® glass used for the active matrix type liquid crystal display has a glass strain point of 593° C. and there is a problem in performing the annealing at 600° C. or more when the increased area of the substrate is taken into consideration.

There has been also another problem in terms of productivity that it takes more than 20 hours for the heat treatment for crystallization.

In order to solve such problems, the inventors had developed a technology which allows the crystallization to be achieved at 550° C. in about 4 hours of treatment time by depositing a trace amount of a certain kind of metal element such as nickel and palladium on the surface of the amorphous silicon film and then by heating it (Japanese Patent Laid-Open No. 6-244103, the disclosure thereof being incorporated herein by reference).

It is possible to obtain a silicon film having a better crystallinity when it is annealed at 600° C. for 4 hours.

This technology allows a crystal silicon film having a large area to be obtained on a low cost glass substrate with a high productivity.

As methods for introducing such a trace amount of metal element (metal element which promotes the crystallization), there are methods of depositing a coating film of the metal element or its compound by means of sputtering as disclosed in Japanese Patent Laid-Open No. 6-244104, of forming a coating film of the metal element or its compound by means of spin coating or the like as disclosed in Japanese Patent Laid-Open No. 7-130652 and of forming a coating film by decomposing gas containing the metal element by means of thermal decomposition, plasma decomposition or the like as disclosed in Japanese Patent Laid-Open No. 7-335548. The disclosure of these Laid-Opens are incorporated herein by reference.

There is also a method of selectively introducing the metal element to a specific part and of then widening the growth of crystal from the part where the metal element has been introduced to the peripheral part (lateral growth method). The crystal silicon obtained by such a method has an oriented crystal structure and shows very excellent characteristics in response to the orientation.

The methods for fabricating the crystal silicon film by using a certain kind of metal element, e.g. nickel, is very excellent as described above. However, it has been found that there are problems when a TFT is fabricated by using such a crystal silicon film that its device characteristic varies and its reliability is low.

Accordingly, it is an object of the invention disclosed in the present specification to provide a technology which allows a TFT whose device characteristic varies less to be obtained in fabricating the TFT by using the crystal silicon film obtained by using metal element.

SUMMARY OF THE INVENTION

According to one aspect of the invention disclosed in the present specification, a method for fabricating a semiconductor device comprises, as its one exemplary fabrication steps are shown in FIGS. 1A through 2I, steps of forming a crystal silicon film 107 on an insulated surface by using metal element which promotes crystallization of silicon (FIGS. 1A and 1B); forming a mask 109 on the crystal silicon film (FIG. 1C); gettering the metal element to specific regions 111 and 112 of the crystal silicon film by using the mask 109 (FIG. 2E); and forming an active layer 116 of a device by using the mask 109 (which turns out to be a part 115 as its side is etched) (FIG. 2H).

According to another arrangement of the invention, a method for fabricating a semiconductor device comprises steps of forming a crystal silicon film on an insulated surface by using metal element which promotes crystallization of silicon; forming a mask on the crystal silicon film; selectively doping element selected among nitrogen, phosphorus, arsenic antimony and bismuth to the crystal silicon film by using the mask; performing a heat treatment to getter the metal element to regions which have been doped; and removing the doped regions by using the mask. In the arrangement described above, what is most effective as the dopant is phosphorus.

According to a still other arrangement of the invention, a method for fabricating a semiconductor device comprises steps of forming a crystal silicon film on an insulated surface by using metal element which promotes crystallization of silicon; forming a mask on the crystal silicon film; selectively doping element selected among nitrogen, phosphorus, arsenic, antimony and bismuth to the crystal silicon film by using the mask; performing a heat treatment to getter the metal element to regions which have been doped; and forming an active layer of a device by using the regions from which the metal element has been gettered by utilizing the mask.

According to a still other arrangement of the invention, a method for fabricating a semiconductor device comprises, as its concrete fabrication steps are shown in FIGS. 1A through 2I, steps of forming a crystal silicon film 107 on an insulated surface by using metal element which promotes crystallization of silicon (FIGS. 1A and 1B); forming a mask 109 on the crystal silicon film 107 (FIG. 1C); selectively doping element selected among nitrogen, phosphorus, arsenic, antimony and bismuth (phosphorus in this case) to the crystal silicon film by using the mask 109 (FIG. 1D); performing a heat treatment to getter the metal element to regions 111 and 112 which have been doped (FIG. 2E); and etching regions of the gettered regions adjacent to the doped regions in a manner of self-alignment by utilizing the mask 113 (FIG. 2H). It is possible to introduce other elements instead of phosphorus as far as gettering effects can be expected.

The above-mentioned steps are characterized in that phosphorus is doped by using the mask 109 and that a pattern 116 is obtained by using the pattern 115 which has been obtained by side-etching the mask 109.

It allows the regions of the mask 113 adjacent to regions 111 and 112 to be removed and to suppress nickel element from influencing on the region 116.

In the invention disclosed in the present specification, it is most preferable to use Ni (nickel) as the metal element which promotes the crystallization of silicon.

Further, one or a plurality of types of metal elements selected among Fe, Co, Ni, Ru, Rh, Pd, Os, Ir, Pt, Cu and Au may be used as the metal element which promotes the crystallization of silicon.

Still more, a compound film represented as $Si_xGe_{1-x}$ ($0<x<1$) may be used instead of the crystal silicon film. In this case, the amorphous silicon film, i.e. the starting film, may be made of the compound film represented as $Si_xGe_{1-x}$ ($0<x<1$).

The specific nature of the invention, as well as other objects, uses and advantages thereof, will clearly appear from the following description and from the accompanying drawings.

BRIEF DESCRIPTION OF DRAWINGS

FIGS. 12A through 12F show schematic structures of equipments utilizing the present invention.

DESCRIPTION OF PREFERRED EMBODIMENTS

[First Embodiment]

Figure 1A:
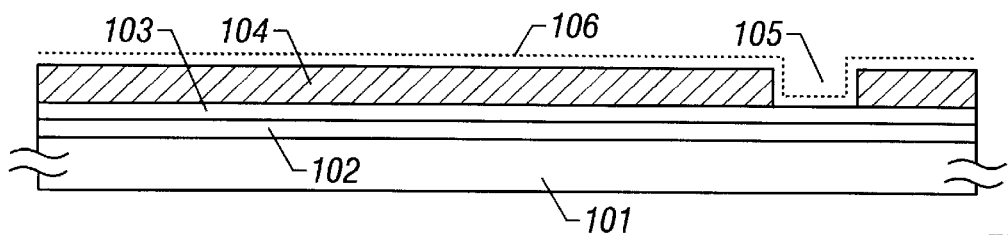
FIGS. 1A through 1D are diagrammatic views showing steps for fabricating a TFT.

FIGS. 1A–1D, 2E–2I and 3J–3M are diagrammatic views showing steps for fabricating a TFT according to a first embodiment. At first, a silicon oxide film is formed so as to be 300 nm in thickness as an underlying film on a glass substrate 101 as shown in FIG. 1A by means of plasma CVD or sputtering.

Next, an amorphous silicon film 103 is formed so as to be 50 nm in thickness by means of low pressure thermal CVD. The thickness of the amorphous silicon film may be selected from a range from 20 to 100 nm.

Beside the amorphous silicon film, a compound containing silicon represented as $Si_xGe_{1-x}$ may be utilized.

Further, a silicon oxide film not shown is formed so as to be 120 nm in thickness by means of plasma CVD. Then, this silicon oxide film is patterned to form a mask 104.

A slit-like opening 105 is created on the mask 104. This opening 105 has a thin and long shape longitudinally from the front side to the depth direction of the figure as shown in FIG. 1A.

Next, a nickel acetate solution containing 10 ppm (in terms of weight) of nickel is applied and an extra solution thereof is removed by a spinner. Thus, a state in which nickel element is held in contact with the surface of the specimen as indicated by the reference numeral (106) in FIG. 1A is obtained.

In the state shown in FIG. 1A, the nickel element is held in contact selectively with the surface of the amorphous silicon film 103 in the region of the opening 105.

As methods for introducing nickel, there are methods of plasma CVD, of sputtering, of plasma treatment by discharging from an electrode containing nickel, of gas adsorption, of ion implantation and the like.

Figure 1B:
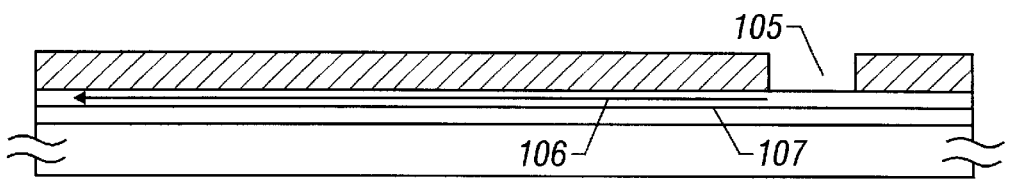

Next, this specimen is heated for 4 hours within a nitrogen atmosphere at 600° C. In this step, the nickel element diffuses from the region where the opening 105 is provided into the amorphous silicon film and thereby, the crystallization advances as indicated by an arrow 106 as shown in FIG. 1B This crystallization is observed as a singular one which advances along the direction parallel to the substrate. Thus, a crystal silicon film 107 whose crystal growth has advanced in the direction parallel to the substrate as indicated by the arrow 106 is obtained.

The condition of the above-mentioned heating for the crystallization may be selected from a range from 550 to 700° C. When nickel element is used, it is not so effective to increase the heating temperature.

After finishing the crystallization, the mask 104 made of the silicon oxide film is removed. Next, infrared rays are irradiated to anneal the silicon film. This step reduces defects in the region where the crystallization has advanced and enhances the crystallinity.

It is also possible to irradiate excimer laser in the ultraviolet region, not the infrared ray. The irradiation of laser light is effective in promoting the unequilibrium state within the film and in causing nickel element to be readily moved. It also has an effect of promoting the crystallization as a matter of course.

Figure 1C:
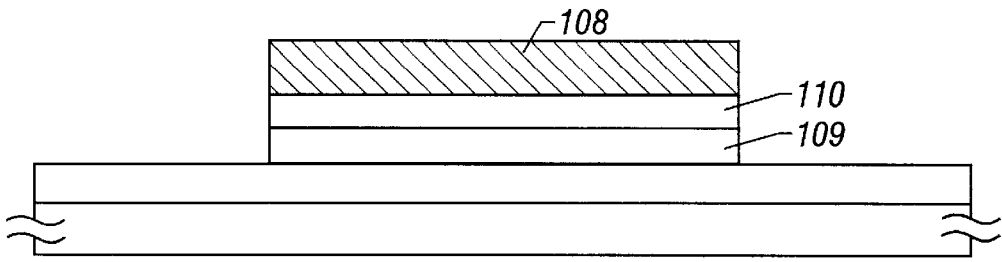

Next, a silicon oxide film and a silicon nitride film not shown are formed so as to be 200 nm in thickness, respectively, by means of plasma CVD. Then, a resist mask 108 is formed and the silicon oxide film and the silicon nitride film formed before are patterned by means of dry etching as shown in FIG. 1C.

Thus, a state in which a pattern 109 of the silicon oxide film and a pattern 110 of the silicon nitride film are laminated is obtained. The laminated pattern is formed on the region where the crystal silicon film 107 has been grown.

Figure 1D:
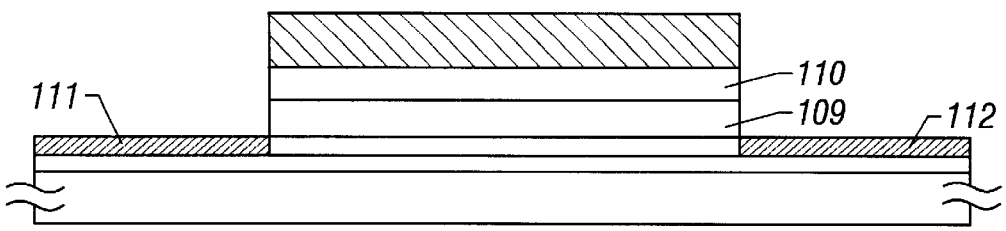

Next, phosphorus is doped on the surface of the exposed silicon film as shown in FIG. 1D. Here, phosphorus ions are accelerated and implanted to regions 111 and 112 by using plasma doping.

Although the case of doping phosphorus ions by accelerating and implanting the ions is shown here, it is possible to adopt the following other methods as doping methods, each comprising steps of:

(1) forming a film containing phosphorus and performing a laser annealing or a heat treatment;

(2) forming a film containing phosphorus which is formed by applying a solution such as a PSG film and performing a laser annealing or a heat treatment; and (3) performing a laser annealing within an atmosphere containing phosphorus.

Next, a heat treatment is performed within a nitrogen atmosphere at 600° C. for 2 hours. The condition of the heat treatment may be selected from a range from 400° C. to a strain point of the substrate. It may be selected from a range from 400 to 650° C. in general.

Figure 2E:
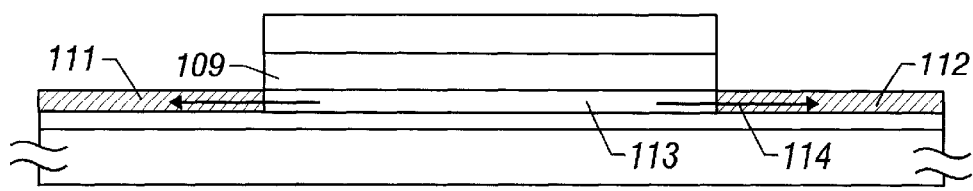
FIGS. 2E through 2I are diagrammatic views showing steps for fabricating the TFT.

Through this heat treatment, nickel element moves from a region 113 to the regions 111 and 112 as indicated by arrows 114 in FIG. 2E. That is, the nickel element existing in the region 113 is gettered to the regions 111 and 112.

Such a phenomenon is observed due to the reasons of that;

(1) phosphorus doped selectively to the regions 111 and 112 is apt to combine with nickel; and (2) the regions 111 and 112 have been damaged during the doping and defects which trap nickel have been formed in high density. Therefore, the nickel element readily moves to these regions.

Phosphorus combines with nickel in various ways as represented by $Ni_3P$, $Ni_5P_2$, $Ni_2P$, $Ni_3P_2$, $Ni_2P_3$, $NiP_2$ and $NiP_3$ and these combinations are very stable at least in an atmosphere in temperature of about 700° C. or less. Accordingly, nickel moves from the region 113 to the regions 111 and 112 unilaterally.

The concentration of nickel element in the region 113 decreases by several times as compared to that in the regions 111 and 112 through the step shown in FIG. 2E.

Figure 4:
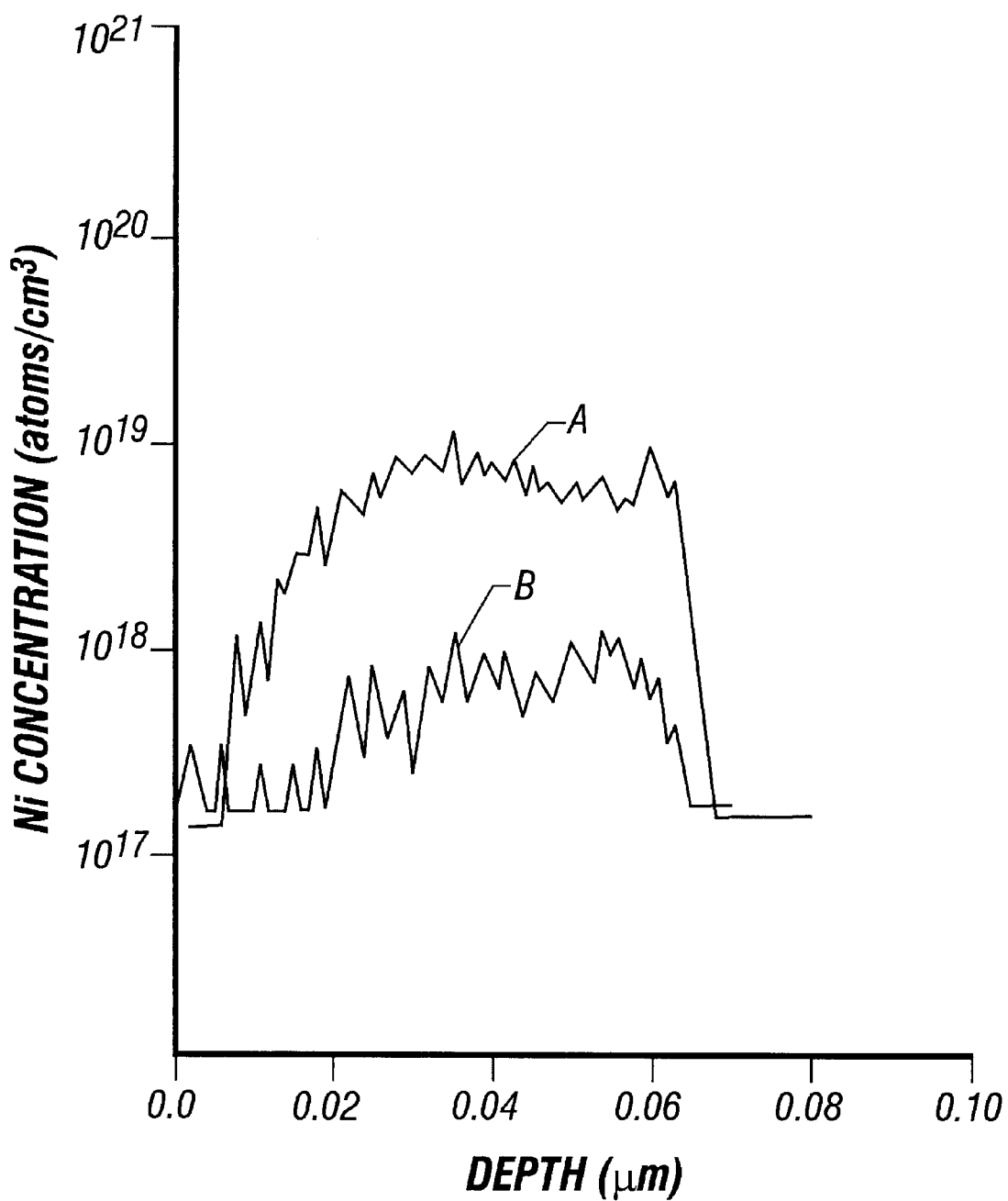
FIG. 4 is a chart showing concentration of nickel element in a region to which phosphorus has been doped and a region not doped.

FIG. 4 shows a result of concentration of the residual nickel element in the region where phosphorus has been doped (the region corresponding to the region 111 in FIG. 2E) and in the region not doped (the region corresponding to the region 113 in FIG. 2E) measured by SIMS (secondary ion mass spectroscopy) on a specimen processed under the similar condition with the present embodiment.

A measured curve A in FIG. 4 represents the concentration of nickel element in the region where phosphorus ions have been accelerated and implanted. A measured curve B in FIG. 4 represents the concentration of nickel element in the region where no phosphorus ions have been accelerated and implanted.

It is noted that it had been confirmed that there is no specific difference in the concentration in those two regions when no phosphorus ions are implanted and no heat treatment thereafter is performed.

Figure 2F:
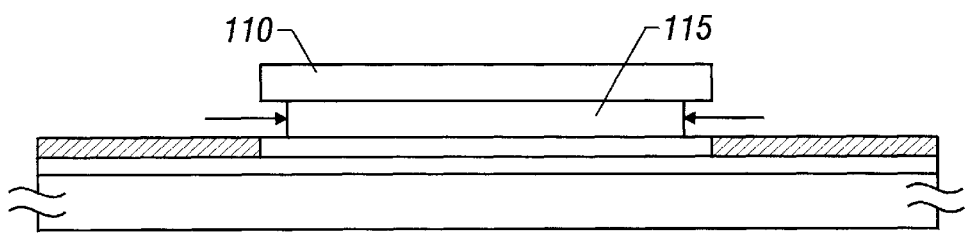

After finishing the step shown in FIG. 2E, isotropic etching is performed to the silicon oxide film pattern 109 by masking with the silicon nitride film pattern 110 as shown in FIG. 2F. That is, the side of the silicon oxide film 109 is etched. Thus, a silicon oxide film pattern 115 whose periphery has been etched is obtained as shown in FIG. 2F.

Figure 2G:
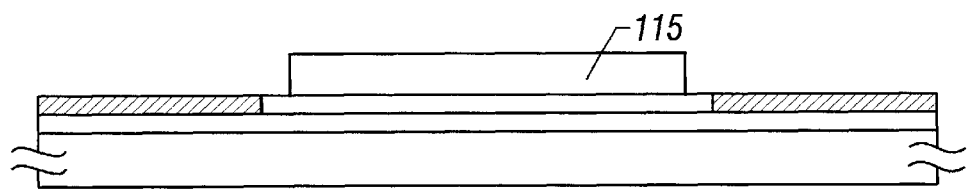

Next, the silicon nitride film pattern 110 is removed as shown in FIG. 2G.

Figure 2H:
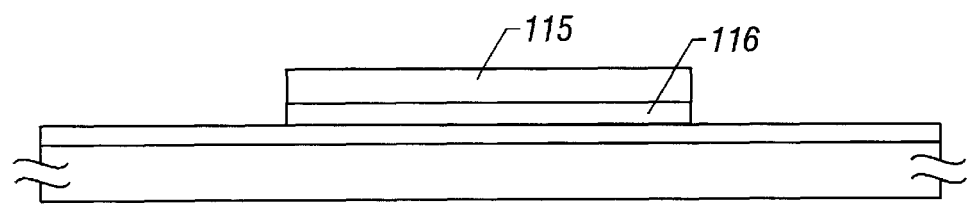

Next, the exposed silicon film is removed while masking with the silicon oxide film pattern 115 as shown in FIG. 2H. Thus, a crystal silicon film pattern 116 which is composed of the region where the crystal has grown as indicated by the arrow 106 in FIG. 1B is obtained.

This silicon film pattern 116 is formed by utilizing the region 113 where nickel has been gettered. This silicon film pattern 116 turns out to be an active layer of the TFT later.

In forming the pattern 116, the nickel element existing in high concentration in the regions 111 and 112 is suppressed from getting into the final remaining pattern 116 by adopting the steps shown in FIGS. 2F through 2G. That is, the etched region of the silicon oxide film 115 whose side has been etched in the step in FIG. 2F becomes the margin, preventing the nickel element existing in the regions 111 and 112 from entering the pattern 116.

After finishing the step shown in FIG. 2H, the silicon oxide film pattern 115 is removed next. Then, a silicon oxide film 117 is formed so as to be 100 nm in thickness so as to cover the silicon film pattern 116 by means of plasma CVD as shown in FIG. 2I.

Figure 2I:
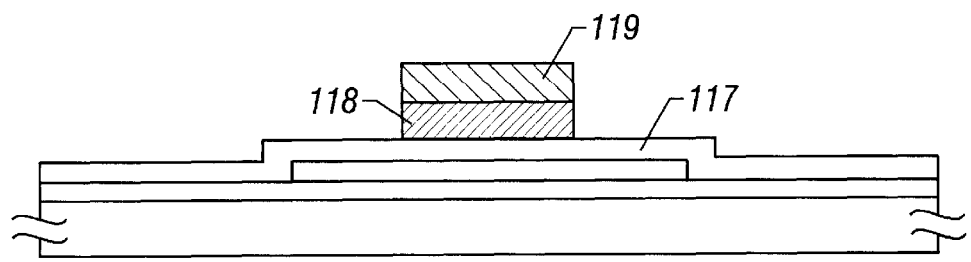

Then, an aluminum film not shown is formed and a pattern made of the aluminum film is formed by using a resist mask 119 as shown in FIG. 2I.

Figure 3J:
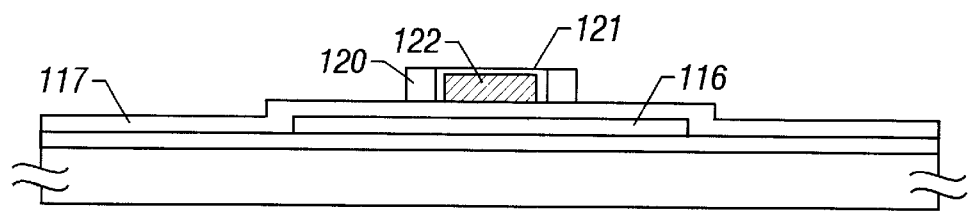
FIGS. 3J through 3M are diagrammatic views showing steps for fabricating the TFT.

Next, a porous anodic oxide film 120 (aluminum oxide film) is formed so as to be 500 nm in thickness by means of anodic oxidation as shown in FIG. 3J. At this time, the porous anodic oxide film 120 is formed on the side of the pattern because the resist mask 119 exists. An aqueous solution containing 3% of oxalic acid is used as an electrolyte in forming the porous anodic oxide film 120.

Next, the resist mask 119 is removed and another anodic oxidation is performed. In this step, an ethylene glycol solution containing 3% of tartaric acid neutralized by aqueous ammonia is used as an electrolyte. In this step, a anodic oxide film 121 having a minute film quality is formed so as to be 80 nm in thickness. The anodic oxide film 121 is formed on the circumference and the surface of the aluminum pattern 122 because the electrolyte infiltrates to the inside of the porous anodic oxide film 120. The remaining aluminum pattern 122 turns out to be a gate electrode. Thus, a state shown in FIG. 3J is obtained.

Figure 3K:
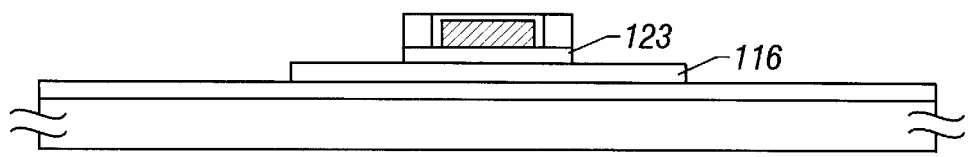

Next, the exposed silicon oxide film 117 is removed by means of dry etching. Then, a remaining silicon oxide film 123 is obtained. Thus, a state shown in FIG. 3K is obtained.

Next, the porous anodic oxide film 120 is removed. Then, phosphorus is doped in order to fabricate an NTFT (N channel type TFT) in the step in FIG. 3L. Here, plasma doping is used as a method for doping phosphorus. It is noted that a PTFT (P channel type TFT) may be fabricated by doping boron.

Figure 3L:
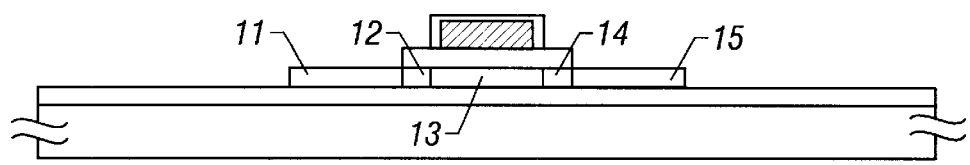

Phosphorus is doped selectively to the active layer pattern 116. Through this step, a source region 11, a low concentrate impurity region 12, a channel region 13, a low concentrate impurity region 14 and a drain region 15 are formed in a manner of self-alignment as shown in FIG. 3L.

Here, the regions 12 and 14 turn out to be the low concentrate impurity regions by the following reasons ("low concentrate" means that the concentration of impurity deciding a channel type is low as compared to that of the source and drain regions).

The silicon oxide film 123 remains on the regions 12 and 14. Accordingly, part of phosphorus ions accelerated and implanted to the regions 12 and 14 are blocked by the silicon oxide film 123. As a result, phosphorus is doped to the regions 12 and 14 in low concentrate as compared to that of the regions 11 and 15.

The region 13 turns out to be a channel region, because the gate electrode 122 and the anodic oxide film 121 around that mask it and no phosphorus is doped there.

It is noted that when the turn-around of ions and the diffusion of electric field are neglected, an offset gate region (which functions as a high resistant region similarly to the low concentrate impurity region) is formed in adjacent to the channel region by the thickness of the anodic oxide film 121.

However, the thickness of the anodic oxide film 121 is as thin as 80 nm in the present embodiment, so that its existence is negligible when the turn-around of phosphorus ions during doping is taken into consideration.

Figure 3M:
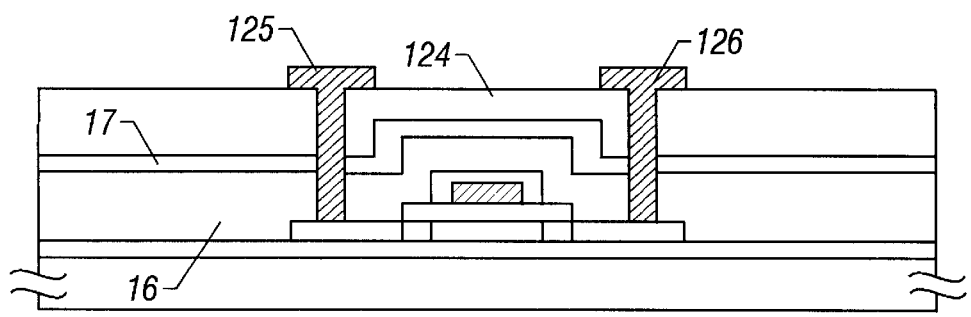

Next, an silicon oxide film 16 is formed as an interlayer insulating film by means of plasma CVD and a silicon nitride film 17 is formed further by means of plasma CVD as shown in FIG. 3M.

Then, a polyimide resin film 124 is formed. Using the resin film allows the surface thereof to be flattened. Beside polyimide, polyamide, polyimide amide, acryl, epoxy and the like may be used.

Next, contact openings are created to form a source electrode 125 and a drain electrode 126. Thus, a thin film transistor is completed as shown in FIG. 3M.

[Second Embodiment]

The present embodiment relates to an improvement of the fabrication steps shown in FIGS. 1A through 3M.

FIGS. 5A through 5E show part of steps for fabricating a TFT according to the second embodiment.

Figure 5A:
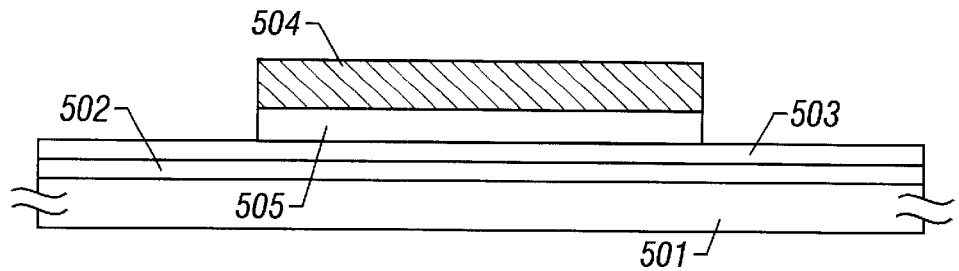
FIGS. 5A through 5E are diagrammatic views showing steps for fabricating a TFT.
Figure 5B:
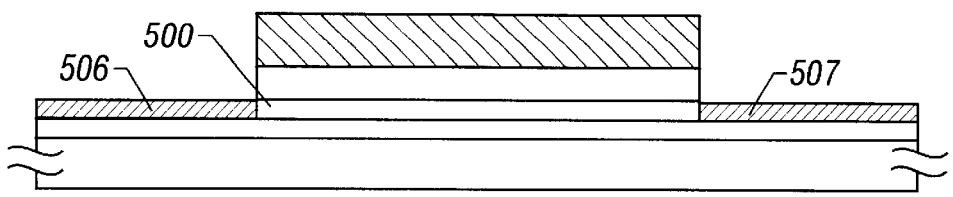

At first, as shown in FIG. 5A, a crystal silicon film 503 which is crystallized at least partly in accordance to the fabrication steps shown in FIGS. 1A and 1B is obtained on a glass substrate 501. Here, there is formed an underlying silicon oxide film 502.

Next, a silicon oxide film not shown is formed. Then, the silicon oxide film is patterned by utilizing a resist mask 504 to obtain a pattern 505 as shown in FIG. 5A.

Further, phosphorus ions are accelerated and implanted by means of plasma doping. Thus, the accelerated phosphorus ions are implanted to regions 506 and 507 shown in FIG. 5B. No phosphorus ions are implanted to a region 500.

Figure 5C:
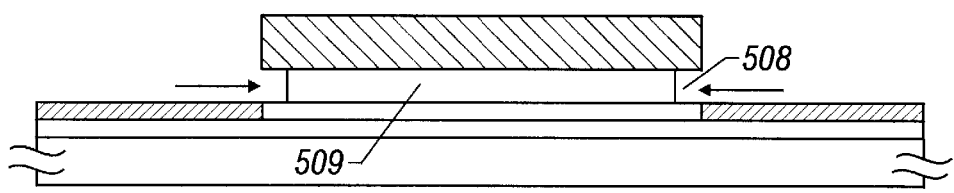

Next, the side of the silicon oxide film pattern 505 is etched as indicated by the reference numeral (508) (side etching) by utilizing the resist mask 504 as shown in FIG. 5C. Thereafter, the resist mask 504 is removed.

Figure 5D:
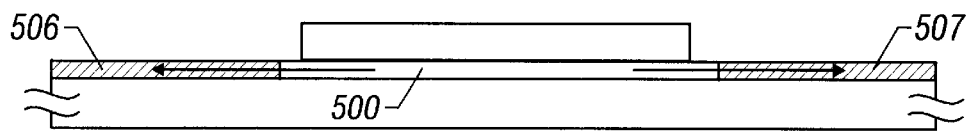

Then, a heat treatment is implemented as shown in FIG. 5D. This heat treatment is implemented within a nitrogen atmosphere at 600° C. for 2 hours.

In this step, nickel element moves from the region 500 to the regions 506 and 507. That is,. the nickel element contained in the region 500 is gettered to the regions 506 and 507.

Figure 5E:
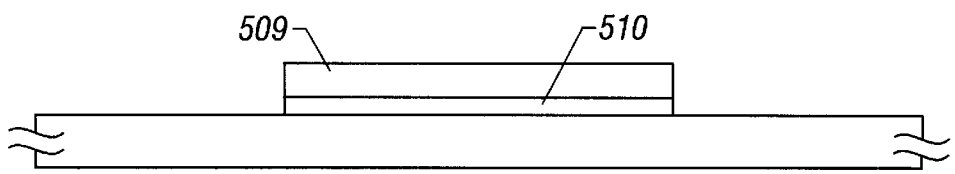

After finishing the heat treatment step shown in FIG. 5D, the silicon film is patterned by masking with the silicon oxide film pattern 509 as shown in FIG. 5E. In this step, the regions 506 and 507 are completely taken away and regions of the region 500 adjacent to the regions 506 and 507 (which correspond to the side etched regions in the above-mentioned step shown in FIG. 5C) are also removed to suppress the nickel element from entering the region which is utilized in the end as an active layer of a device.

After obtaining the state shown in FIG. 5E, the silicon oxide film pattern 509 is removed to obtain the silicon film pattern 510. Then, the TFT is fabricated by using this silicon film pattern 510 as its active layer.

[Third Embodiment]

The present embodiment is a case when crystallization is implemented by a method which is different from the crystal growth in the direction parallel to the substrate as shown in the first embodiment. The present embodiment also uses nickel to obtain a crystal silicon film.

The method of the present embodiment is to crystallize the whole surface of an amorphous silicon film uniformly by introducing nickel element on the whole surface, not to grow crystal in the direction parallel to the substrate by selectively introducing nickel element as described in the first embodiment.

Figure 6A:
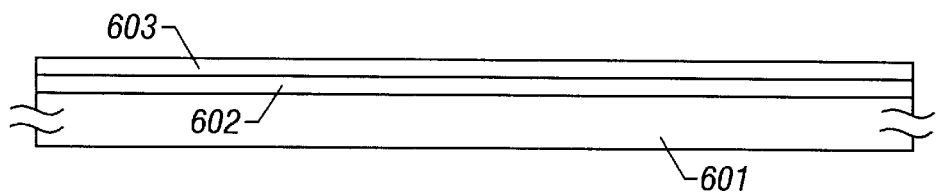
FIGS. 6A through 6C are diagrammatic views showing steps for obtaining a crystal silicon film.
Figure 6B:
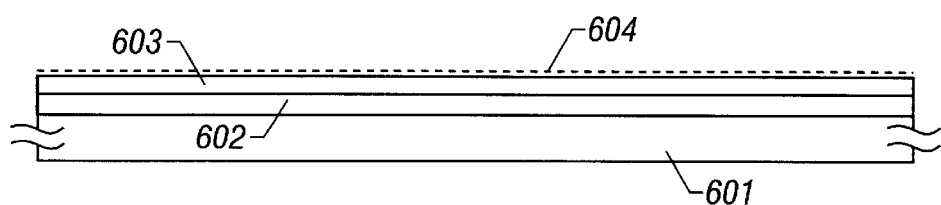
Figure 6C:
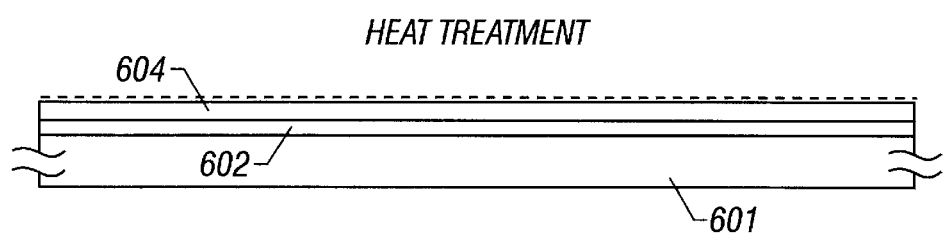

FIGS. 6A through 6C show steps for fabricating a crystal silicon film according to the present embodiment. At first, a silicon oxide film 602 is formed as an underlying film on a glass substrate 601. Next, an amorphous silicon film 603 is formed by means of low pressure thermal CVD or plasma CVD. Thus, a state shown in FIG. 6A is obtained.

Next, a nickel acetate solution is applied on the whole surface of the amorphous silicon film 603. At this time, an extra solution is spun away by using a spinner. It is noted that it is desirable to form a very thin oxide film on the surface of the amorphous silicon film 603 before applying the solution to improve the wettability (hydrophilic property) of the surface of the silicon film to suppress the solution from being repelled. The oxide film may be formed by irradiating UV rays within an oxygen atmosphere, by treating by aqueous ozone, or the like.

Thus, a state as shown in FIG. 6B in which nickel element is held in contact with the surface of the amorphous silicon film 603 as indicated by the reference numeral (604) is obtained.

Next, a heat treatment is implemented to obtain a crystal silicon film 604 as shown in FIG. 6C. This heat treatment may be performed within an nitrogen atmosphere at 600° C. for 4 hours. This heat treatment step allows a state in which the whole film has been crystallized uniformly, not the crystal growth in the specific direction as shown in FIG. 1, to be obtained.

This fabrication steps are characterized in that they are simple as compared to the fabrication steps shown in FIGS.

1A through 1D. However, a TFT having a higher performance may be obtained by utilizing the crystal obtained by using the lateral growth shown in FIGS. 1A through 1D when the TFT is to be fabricated.

[Fourth Embodiment]

Steps for fabricating a PTFT and an NTFT in the same time will be shown in the present embodiment. An arrangement for gettering nickel element from the channel and the low concentrate impurity region to the source and drain regions, in addition to the gettering of nickel element from the active layer, will be shown.

Figure 7A:
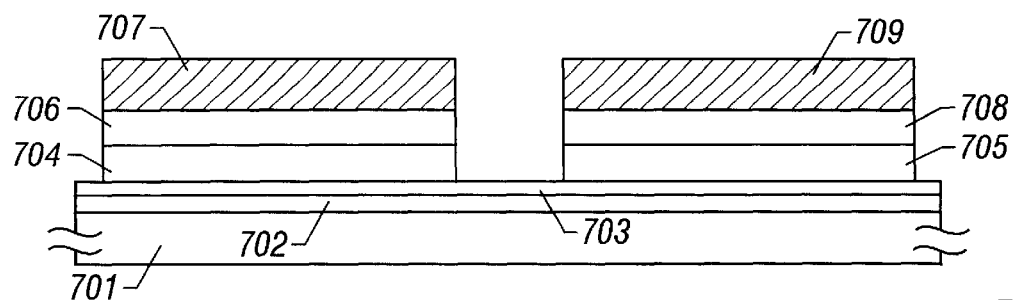
FIGS. 7A through 7E are diagrammatic views showing steps for fabricating a PTFT and an NTFT on one and the same substrate.

FIGS. 7A–7E, 8F–8J, and 9K–9L show the fabrication steps of the present embodiment. At first, an underlying film 702 is formed on a glass substrate 701 and a crystal silicon film (or a silicon film which is crystallized partly) 703 is obtained as shown in FIG. 7A by the previously described methods.

Next, a silicon oxide film and a silicon nitride film not shown are laminated and are patterned by resist masks 707 and 709. Thus, a pattern of laminated films composed of a silicon oxide film pattern 704 and a silicon nitride film pattern 706 is obtained. Similarly, a pattern of laminated films composed of a silicon oxide film pattern 705 and a silicon nitride film pattern 708 is obtained. Thus, a state shown in FIG. 7A is obtained.

Figure 7B:
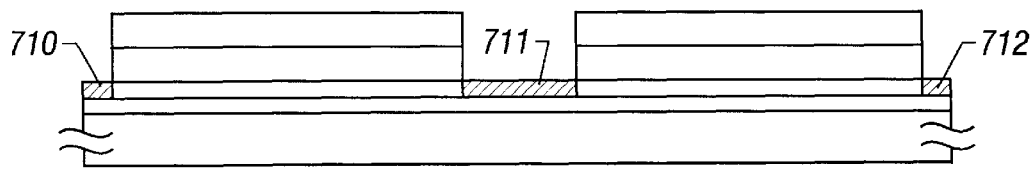

Next, the resist masks 707 and 709 are removed and phosphorus ions are doped by means of plasma doping as shown in FIG. 7B. In this step, the phosphorus ions are doped into regions 710, 711 and 712. After that, nickel element is gettered to the regions 710, 711 and 712 by implementing a heat treatment.

Figure 7C:
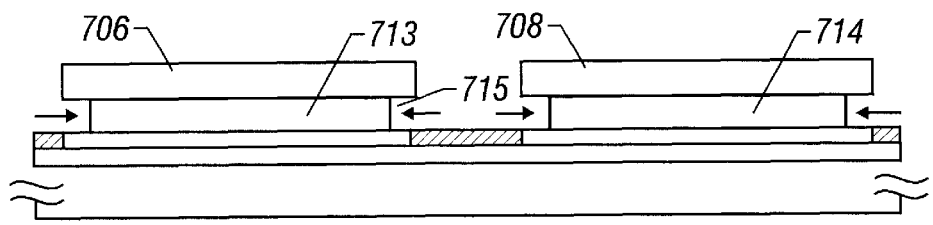

Next, the side of the silicon oxide film pattern 704 is etched by utilizing the silicon nitride film pattern 706 as shown in FIG. 7C. Thus, a silicon oxide film pattern 713 whose side has been etched as indicated by the reference numeral (715) is obtained. Similarly, a silicon oxide film pattern 714 whose side has been etched is obtained.

Figure 7D:
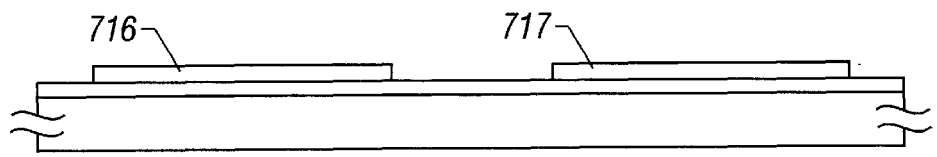

Next, the silicon films at the exposed regions are removed by using the silicon oxide film patterns 713 and 714 as shown in FIG. 7D. Silicon film patterns 716 and 717 obtained here are composed of the regions from which the nickel element has been gettered to the regions 710, 711 and 712 and in which the concentration of nickel element has been dropped.

Figure 7E:
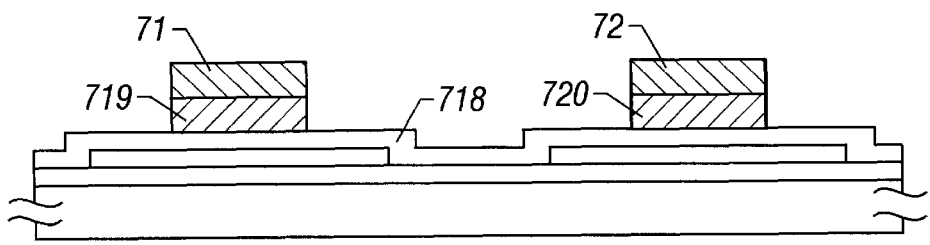

Next, a silicon oxide film 718 which functions as a gate insulating film is formed by means of plasma CVD. Further, aluminum patterns 719 and 720 are formed by forming an aluminum film and by patterning it by using resist masks 71 and 72. Thus, a state shown in FIG. 7E is obtained.

Figure 8F:
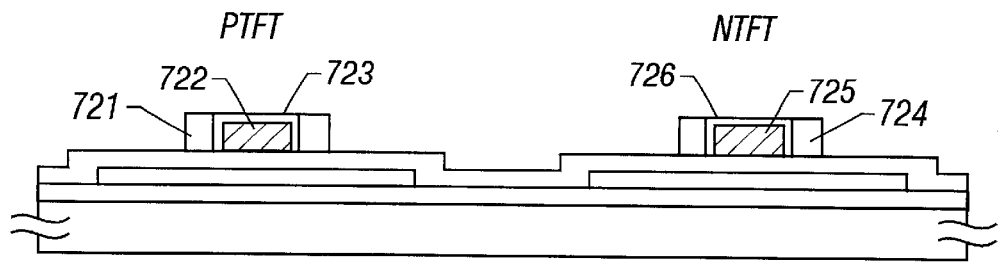
FIGS. 8F through 8J are diagrammatic views showing steps for fabricating the PTFT and the NTFT on one and the same substrate.

Next, porous anodic oxide films 721 and 724 are formed by anodic oxidation as shown in FIG. 8F. Then, the resist masks 71 and 72 are removed and anodic oxide films 723 and 726 having minute film quality are formed. Gate electrodes 722 and 725 are defined in this state.

Figure 8G:
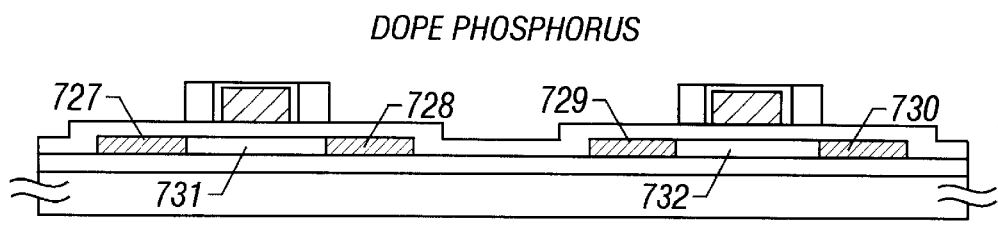

After obtaining the state in FIG. 8F, phosphorus is doped as shown in FIG. 8G. This doping is performed to cause the nickel to be gettered again to the doped regions.

After that, a heat treatment is performed at 400° C. for 1 hour. In this step, the nickel element remaining in a region 731 is gettered to regions 727 and 728. Further, the nickel element remaining in a region 732 is gettered to regions 729 and 730.

Figure 8H:
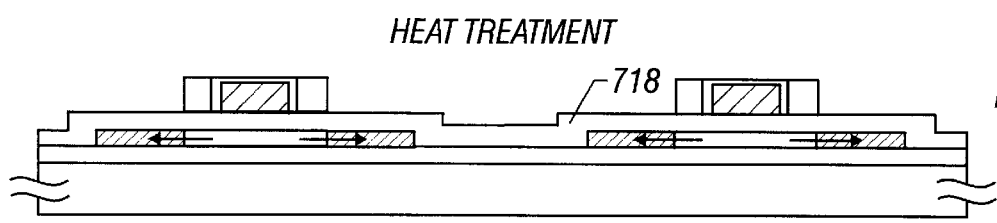

Thus, the nickel element is gettered from the regions 731 and 732 again thoroughly. That is, the nickel element is removed thoroughly from the regions 731 and 732 as shown in FIG. 8H. It is noted that it is important to perform this heat treatment step under the condition (mainly upper limit temperature) in which the gate electrodes 722 and 725 can sustain.

When silicon or silicide is used as the gate electrode, this treatment may be performed in a temperature in which the glass substrate can sustain. In this case, a higher gettering effect can be obtained.

Because the regions 727, 728, 729 and 730 are regions which turn out to be sources and drains in the end, the TFTs are not influenced so much in their operation even if the concentration of nickel element is high more or less. In contrary, the regions 731 and 732 are regions where the channels and low concentrate impurity regions are formed, so that they are sensitive to the existence of nickel element.

That is, because the channel region is the region where a carrier density is changed by an electric field applied from the gate electrode, the existence of the metal element which traps them gives an adverse effect on its operation.

The low concentrate impurity region or the low concentrate impurity region on the drain side in particular has a function of relaxing a high electric field applied between the channel region and the drain region and a relatively high electric field is applied there.

Nickel element within a semiconductor functions as a trap level of the carriers. When the trap level exists in the region where the relatively high electric field is applied, there arises changes in the motion of the carriers and in the characteristics of the semiconductor. Accordingly, the nickel element remaining in the low concentrate impurity region may cause problems such that a leak current is generated and a withstand voltage drops.

Figure 8I:
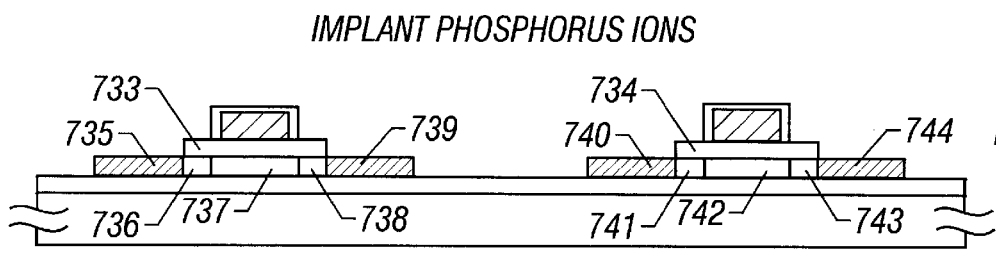

After finishing the gettering step by means of heating shown in FIG. 8H, the exposed silicon oxide film 718 is etched as shown in FIG. 8I. Then, remaining silicon oxide films 733 and 734 are obtained in this state. Further, the porous anodic oxide films 721 and 724 are removed as shown in FIG. 8I.

Phosphorus is doped again in the state shown in FIG. 8I. In this step, phosphorus is doped in high concentration to a region 735, in low concentration to a region 736, in low concentration to a region 738 and in high concentration to a region 739.

In the same time, a drain region 740, a low concentrate impurity region 741, a channel region 742, a low concentrate impurity region 743 and a source region 744 of the NTFT are formed in a manner of self-alignment.

Next, a resist mask 745 is formed on the NTFT and boron is doped this time by means of plasma doping. The conductive type of the regions to which phosphorus has been doped before is reversed by this doping and turns out to be P type.

Figure 8J:
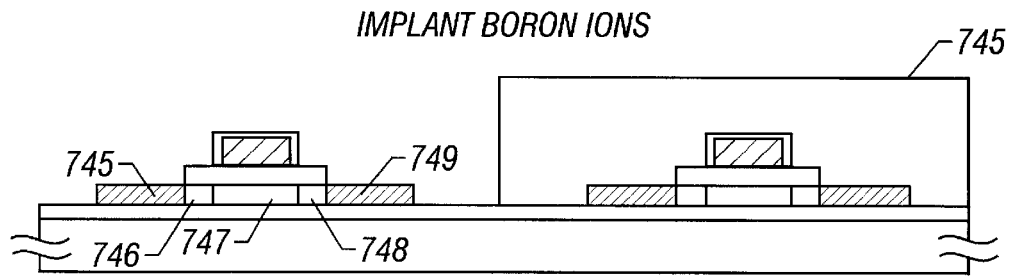

Thus, a source region 745, a low concentrate impurity region 746, a channel region 747, a low concentrate impurity region 748 and a drain region 749 of the PTFT are formed as shown in FIG. 8J in a manner of self-alignment.

Figure 9K:
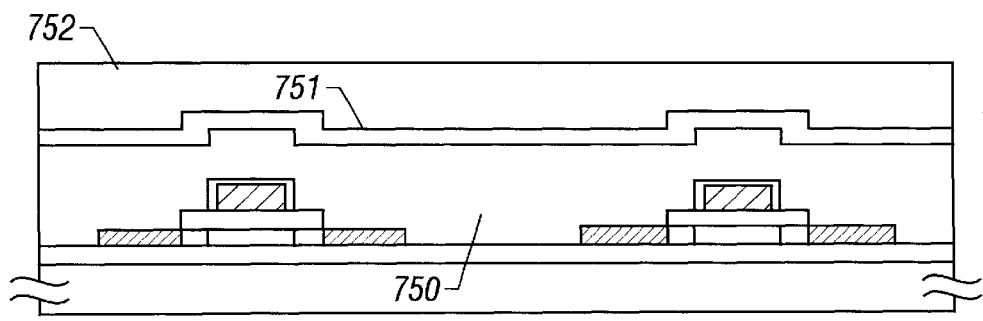
FIGS. 9K through 9L are diagrammatic views showing steps for fabricating the PTFT and the NTFT on one and the same substrate.

Next, a silicon oxide film 750, a silicon nitride film 751 and a resin film 752 are formed as interlayer insulating films as shown in FIG. 9K. Then, contact holes are created to form a source electrode 753 and a drain electrode 754 of the PTFT as well as a source electrode 756 and a drain electrode 755 of the NTFT.

Figure 9L:
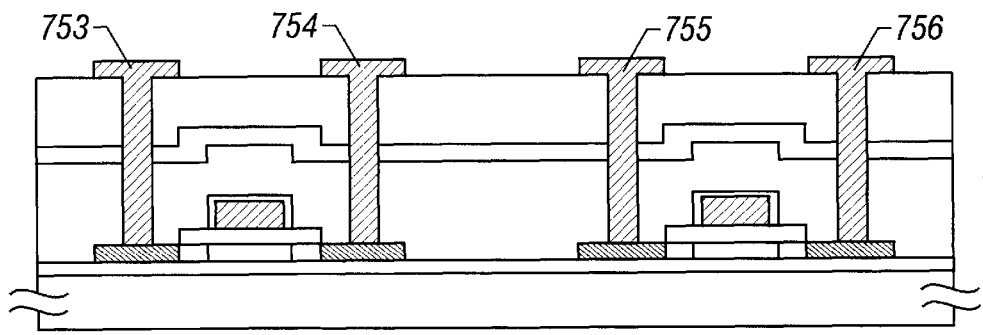

Thus, the NTFT and the PTFT may be formed on one and the same substrate as shown in FIG. 9L through the same fabrication steps.

The step for gettering nickel from the active layer composing the TFT (step in FIG. 7C) and the step for gettering nickel from the channel region and the low concentrate impurity region (step in FIG. 8H) are performed in the present embodiment to thoroughly prevent the nickel element from influencing on the device characteristics of the TFT.

Thereby, the device having a better characteristic and high reliability may be obtained. This is important in constructing integrated circuits.

[Fifth Embodiment]

The present embodiment relates to an arrangement for obtaining a crystal silicon film by a method different from the fabrication steps shown in FIGS. 1A and 1B. This embodiment utilizes the methods as described in Japanese Patent Application No. 8-335152 which has been applied by the present applicant, which in turn corresponds to a pending U.S. application Ser. No. 08/785,489, the disclosure of which is incorporated herein by reference.

An outline of the fabrication steps will be explained by using FIGS. 1A and 1B. Here, a quartz substrate is used instead of the glass substrate as a substrate 101 because this process requires a heat treatment in a high temperature of 900° C. or more which is unsustainable for the glass substrate.

At first, a silicon oxide film 102 is formed as an underlying film on the quartz substrate 101. It is noted that because the quartz substrate having a good flatness is available, the underlying film needs not be formed in such a case.

Next, an amorphous silicon film is formed so as to be 50 nm in thickness by means of low pressure thermal CVD. Further, a mask 104 made of a silicon oxide film is formed as shown in FIG. 1A.

Then, a nickel acetate solution is applied to obtain the state in which nickel element is held in contact on the surface as shown in FIG. 1A.

Then, a heat treatment is implemented within an nitrogen atmosphere at 600° C. for 4 hours to crystallize as shown in FIG. 1B.

Next, the mask 104 is removed and another heat treatment is implemented. This heat treatment is implemented within an oxygen atmosphere containing 3 volume % of HCl at 950° C. for 30 minutes. As a result of this step, a thermal oxide film is formed in a thickness of 30 nm and the thickness of the silicon film is reduced from 50 nm to 35 nm.

The present embodiment is characterized in this step. That is, in this step, nickel element is removed from the whole film to the atmosphere in the shape of nickel chloride.

Further, the crystallinity of the film is remarkably improved as interstitial silicon atoms and silicon atoms unstably combined within the film are consumed for the formation of the thermal oxide film. That is, the density of defects within the film is dramatically reduced.

After finishing the above-mentioned heat treatment, the thermal oxide film thus formed is removed. After that, the TFT is fabricated in accordance to the steps in and after FIG. 1C.

The quartz substrate (or ceramic substrate) needs to be used as the substrate in the present embodiment because no effect of forming the thermal oxide film is obtained unless the temperature is at least 900° C. or more. However, it allows a device having a very high characteristic to be obtained.

The present embodiment allows to obtain the device whose characteristic is stabilized further by the synergetic effect of the effect obtained by performing the step for forming the thermal oxide film and the gettering effect of nickel as shown in the first embodiment.

The fabrication steps of the present embodiment may be utilized also in the fabrication steps shown in FIGS. 6A through 6C.

[Sixth Embodiment]

The present embodiment is a case of fabricating a bottom gate type TFT (an inversely staggered TFT in this case).

Figure 10A:
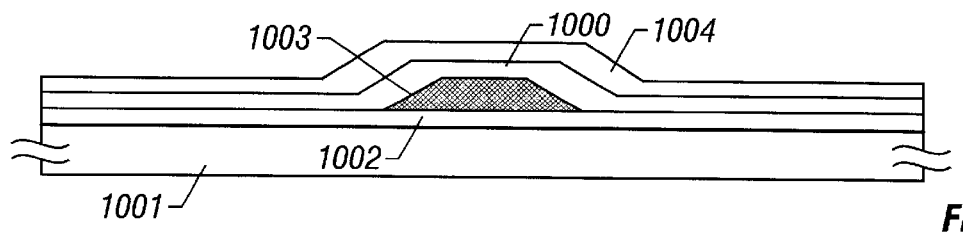
FIGS. 10A through 10D are diagrammatic views showing steps for fabricating a bottom gate type TFT.

At first, a silicon oxide film 1002 is formed as an underlying film on a glass substrate 1001 as shown in FIG. 10A. Then, a gate electrode 1003 is formed by using a silicide material.

Further, a silicon oxide film 1000 which covers the gate electrode 1003 and functions as a gate insulating film is formed. Next, a crystal silicon film 1004 is formed by the methods shown in FIGS. 1 and 6. Thus, a state shown in FIG. 10A is obtained.

Figure 10B:
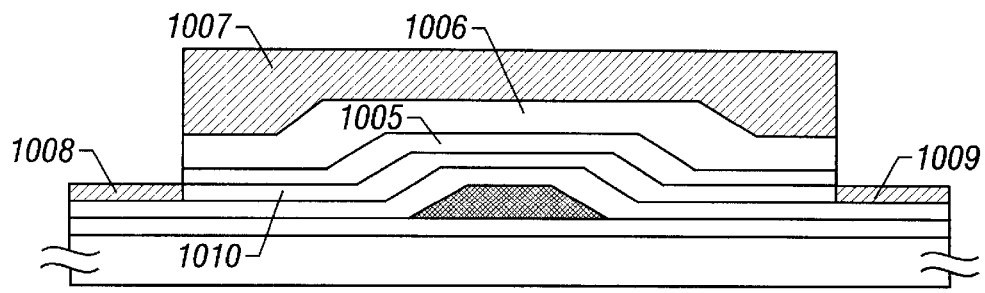

Next a silicon oxide film pattern 1005 and a silicon nitride film pattern 1006 are obtained by using a resist mask 1007 as shown in FIG. 10B. Then, phosphorus is doped. As a result, phosphorus ions are accelerated and implanted to regions 1008 and 1009. No phosphorus ions are implanted to a region 1010.

Figure 10C:
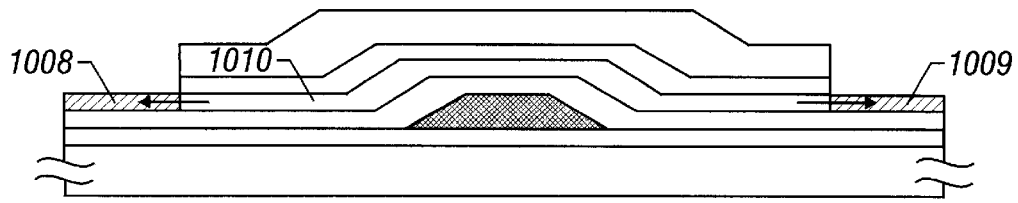

Next, a heat treatment is performed as shown in FIG. 10C. In this step, nickel element existing in the region 1010 is gettered to the regions 1008 and 1009.

Figure 10D:
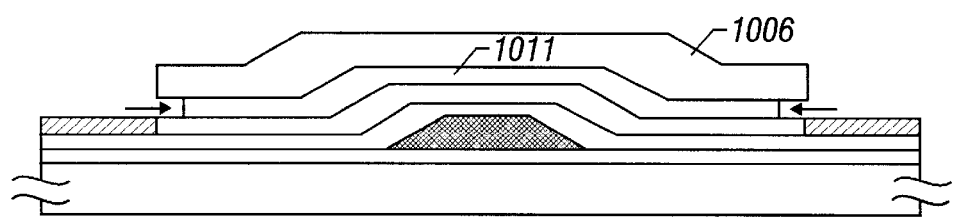

Next, the side of the silicon oxide film pattern 1005 is etched by using the silicon nitride film pattern 1006 to form a pattern 1011 as shown in FIG. 10D.

Figure 11E:
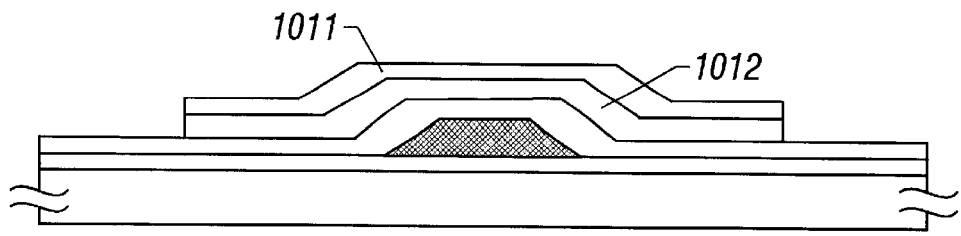
FIGS. 11E through 11H are diagrammatic views showing steps for fabricating the bottom gate type TFT.

Then, the silicon nitride film 1006 is removed and the silicon film region 1010 is patterned by utilizing the silicon oxide film pattern 1011. Thus, a pattern 1012 made of the crystal silicon film is obtained as shown in FIG. 11E.

Figure 11F:
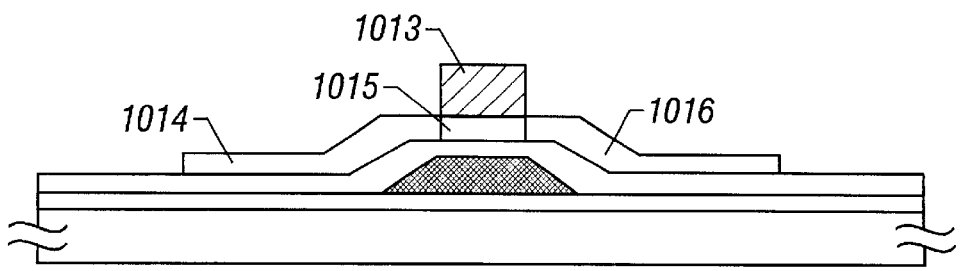

Next, a mask 1013 made of a silicon nitride film is disposed as shown in FIG. 11F and phosphorus is doped by means of plasma doping.

After the doping, laser light is irradiated to activate the dopant and to anneal the doped region. In this step, a source region 1014, a channel region 1015 and a drain region 1016 are formed.

Figure 11G:
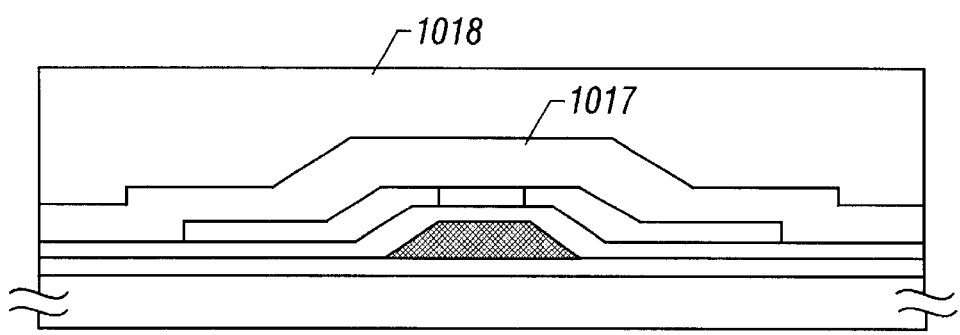

Next, a silicon oxide film 1017 and a resin film 1018 are formed as shown in FIG. 11G.

Figure 11H:
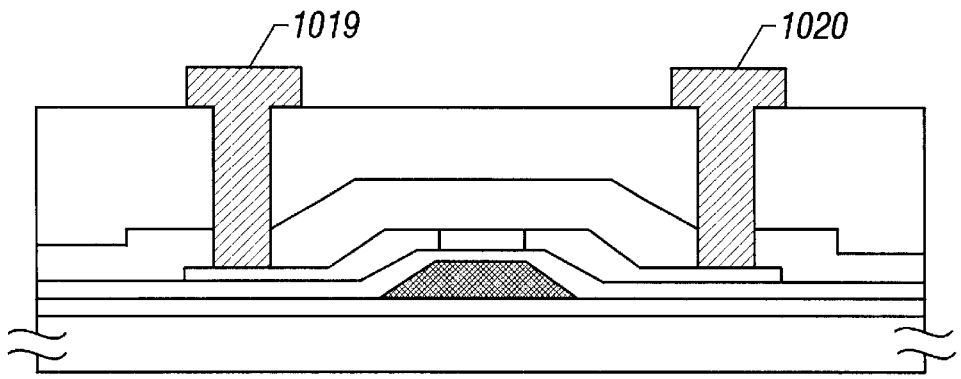

Then, contact holes are created to form a source electrode 1019 and a drain electrode 1020 as shown in FIG. 11H. Thus, the bottom gate type TFT may be obtained.

[Seventh Embodiment]

The present embodiment is a case of using doped silicon or silicide for the gate electrode in the steps for fabricating the TFT shown in FIGS. 7 through 9.

In this case, the gettering effect may be enhanced further because a temperature as high as 600° C. may be applied in the step shown in FIG. 8C.

[Eighth Embodiment]

An outline of each equipment utilizing the invention disclosed in the present specification will be described in the present embodiment. FIGS. 12A through 12F show the outline of each equipment.

FIG. 12A shows a portable information processing terminal having a communication function utilizing telephone lines.

This electronic equipment is provided with an integrated circuit 2006 using thin film transistors within a main body 2001. It also comprises an active matrix type liquid crystal display 2005, a camera section for taking in images and a control switch 2004.

FIG. 12B shows an electronic equipment called a head mount display. This equipment is arranged so as to mount its main body 2101 on a head by a band 2103 and has a function of displaying images artificially in front of eyes. The images are created by liquid crystal display 2102 corresponding to right and left eyes. Such an electronic equipment uses circuits using thin film transistors in order to miniaturize its size and lighten its weight.

FIG. 12C shows an electronic equipment having a function of displaying map data and various data based on signals from satellites. The data from the satellites received by an antenna 2204 is processed by an electronic circuit provided within a main body 2201 and necessary information is displayed on a liquid crystal display 2202.

The equipment is controlled by control switches 2202. A circuit using thin film transistors is used also in such an equipment in order to miniaturize the whole structure.

FIG. 12D shows a portable telephone. This electronic equipment comprises an antenna 2306, a voice output section 2302, a liquid crystal display 2304, control switches 2305 and a voice input section 2303 on a main body 2301.

An electronic equipment shown in FIG. 12E is a portable image pickup device called a video camera. This electronic equipment comprises a liquid crystal display 2402 mounted on a closing member of a main body 2401 and control switches 2404 mounted on the closing member.

It also comprises an image receiving section 2406, an integrated circuit 2407, a voice input section 2403, control switches 2404 and a battery 2405 in the main body 2401.

An electronic equipment shown in FIG. 12F is a projector type liquid crystal display. This equipment comprises a light source 2502, a liquid crystal display 2503 and an optical system 2504 in a main body 2501 and has a function of projecting images on a screen 2505.

As the liquid crystal display in each electronic equipment described above, either transmission type or reflection type display may be used. Although the transmission type display is advantageous in terms of displaying characteristics, the reflection type is advantageous in pursuing lower power consumption, miniaturization and lightening.

Further, as the display unit, a flat panel display such as an active matrix type EL display and a plasma display may be utilized.

[Ninth Embodiment]

Other steps for obtaining a pattern from which metal element has been gettered (removed) by using a crystal silicon film obtained by utilizing the metal element will be shown in the present embodiment.

Figure 13A:
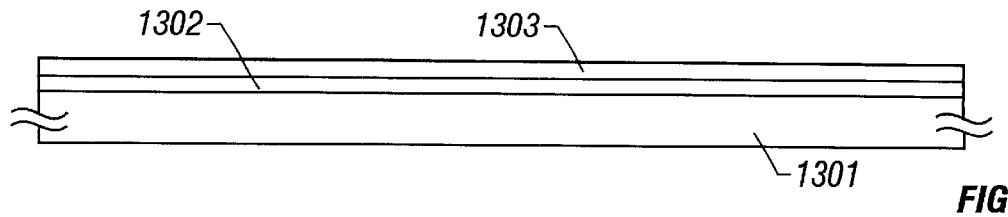
FIGS. 13A through 13E are diagrammatic views showing a part of steps for fabricating a TFT.

FIGS. 13A through 13E show the fabrication steps of the present embodiment. At first, an underlying film 1302 is formed on a glass substrate 1301 and a crystal silicon film 1303 is obtained by utilizing nickel element as shown in FIG. 13A.

Figure 13B:
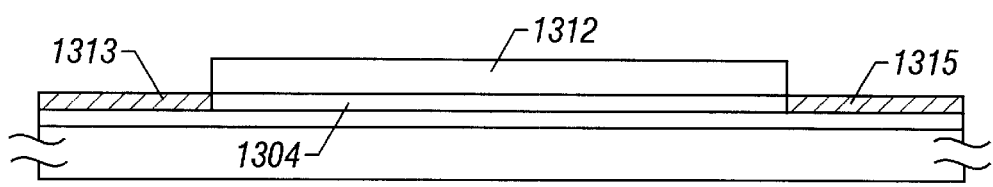

Next, a mask 1312 made of a silicon oxide film is formed. Then, phosphorus is doped. In this step, the phosphorus is doped to regions 1313 and 1315 as shown in FIG. 13B. No phosphorus is doped to a region 1304.

A heat treatment is performed in the state shown in FIG. 13B to getter the nickel element existing in the region 1304 to the regions 1313 and 1315.

Figure 13C:
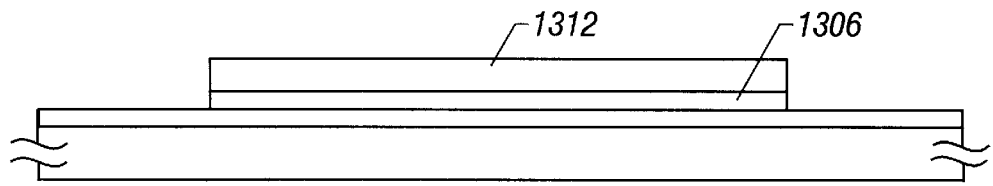

Next, the regions 1313 and 1315 are removed by using the mask 1312 made of the silicon oxide film as shown in FIG. 13C.

Figure 13D:
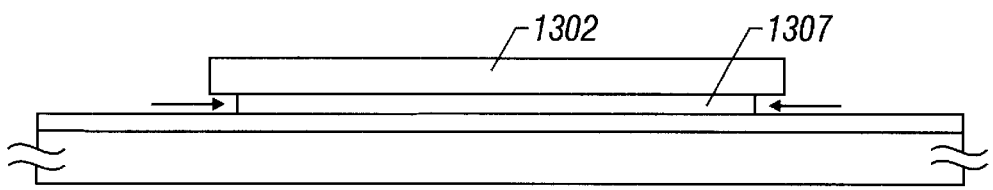

Then, the side of a region 1306 is etched by using the mask 1312 made of the silicon oxide film. Thus, a pattern 1307 made of the crystal silicon film is obtained as shown in FIG. 13D.

Figure 13E:
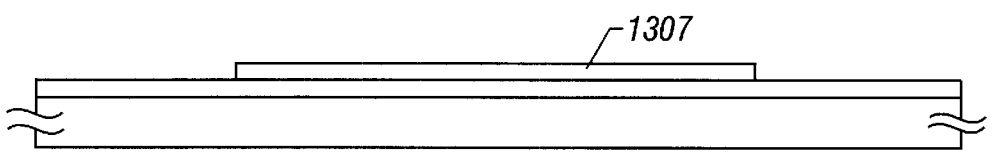

Next, the mask 1312 made of the silicon oxide film is removed to obtain a state shown in FIG. 13E. Thereafter, a TFT is fabricated by utilizing the pattern 1307 made of the crystal silicon film.

[Tenth Embodiment]

According to the present embodiment, in the steps shown in FIGS. 2E and 2F, the regions 111 and 112 are removed by utilizing the silicon oxide film pattern 109 before etching its side and then the side of the pattern 109 as well as the peripheral part of the exposed region 113 are etched.

Thereby, although the steps become complicated, it is possible to thoroughly suppress nickel which flies around in etching the regions 111 and 112 from getting into the finally remaining region 116.

As described above, the utilization of the invention disclosed in the present specification allows the technology of obtaining the TFT whose device characteristic varies less to be provided in obtaining the TFT by using the crystal silicon film obtained by using metal element.

While preferred embodiments have been described, variations thereto will occur to those skilled in the art within the scope of the present inventive concepts which are delineated by the following claims.

What is claimed is:

1. A method of manufacturing a semiconductor device comprising the steps of:

disposing a conductive material on an insulating surface over a substrate;

forming an insulating film at least on said conductive material;

forming an amorphous semiconductor film on said insulating film;

providing said amorphous semiconductor film with a crystallization promoting material;

crystallizing said amorphous semiconductor film provided with said crystallization promoting material by a heat treatment;

covering a selected portion of said semiconductor film with a mask;

introducing a gettering material into a semiconductor region not covered with said mask; and heating said semiconductor film so that said crystallization promoting material is gettered by said gettering material.

2. A method according to claim 1 wherein said conductive material comprises a silicide material.

3. A method according to claim 1 wherein said crystallization promoting material is one selected from the group consisting of Fe, Co, Ni, Ru, Rh, Pd, Os, Ir, Pt, Cu, and Au.

4. A method according to claim 1 wherein said amorphous semiconductor film comprises silicon or silicon germanium.

5. A method according to claim 1 wherein said gettering material is one selected from the group consisting of phosphorus, nitrogen, arsenic, antimony, and bismuth.

6. A method according to claim 1 wherein said gettering material is introduced into said semiconductor film by a plasma doping method.

7. A method according to claim 1 wherein said semiconductor device is an EL display device.

8. A method according to claim 1 wherein said semiconductor device is at least one selected from the group consisting of a portable information processing terminal, a head mount display, an electronic equipment having a function of displaying a map data, a portable telephone, a video camera, and a projector.

9. A method of manufacturing a semiconductor device comprising the steps of:

forming an amorphous semiconductor film on an insulating surface over a substrate;

providing said amorphous semiconductor film with a crystallization promoting material;

crystallizing said amorphous semiconductor film provided with said crystallization promoting material by a heat treatment;

covering a selected portion of said semiconductor film with a mask;

introducing a gettering material into a semiconductor region not covered with said mask;

heating said semiconductor film so that said crystallization promoting material is gettered by said gettering material; and patterning said semiconductor film into at least one active layer of a thin film transistor, wherein said active layer is formed so as not to be in contact with said region.

10. A method according to claim 9 wherein said crystallization promoting material is one selected from the group consisting of Fe, Co, Ni, Ru, Rh, Pd, Os, Ir, Pt, Cu, and Au.

11. A method according to claim 9 wherein said amorphous semiconductor film comprises silicon or silicon germanium.

12. A method according to claim 9 wherein said gettering material is one selected from the group consisting of phosphorus, nitrogen, arsenic, antimony, and bismuth.

13. A method according to claim 9 wherein said gettering material is introduced into said semiconductor film by a plasma doping method.

14. A method according to claim 9 wherein said semiconductor device is an EL display device.

15. A method according to claim 9 wherein said semiconductor device is at least one selected from the group consisting of a portable information processing terminal, a head mount display, an electronic equipment having a function of displaying a map data, a portable telephone, a video camera, and a projector.

16. A method of manufacturing a semiconductor device comprising the steps of:

forming an amorphous semiconductor film on an insulating surface over a substrate;

providing said amorphous semiconductor film with a crystallization promoting material;

crystallizing said amorphous semiconductor film provided with said crystallization promoting material by a heat treatment;

covering a selected portion of said semiconductor film with a mask;

introducing a gettering material into a semiconductor region not covered with said mask;

heating said semiconductor film so that said crystallization promoting material is gettered by said gettering material; and patterning said semiconductor film into at least one active layer of a thin film transistor, wherein said patterning step is performed to remove at least said region.

17. A method according to claim 16 wherein said crystallization promoting material is one selected from the group consisting of Fe, Co, Ni, Ru, Rh, Pd, Os, Ir, Pt, Cu, and Au.

18. A method according to claim 16 wherein said amorphous semiconductor film comprises silicon or silicon germanium.

19. A method according to claim 16 wherein said gettering material is one selected from the group consisting of phosphorus, nitrogen, arsenic, antimony, and bismuth.

20. A method according to claim 16 wherein said gettering material is introduced into said semiconductor film by a plasma doping method.

21. A method according to claim 16 wherein said semiconductor device is an EL display device.

22. A method according to claim 16 wherein said semiconductor device is at least one selected from the group consisting of a portable information processing terminal, a head mount display, an electronic equipment having a function of displaying a map data, a portable telephone, a video camera, and a projector.

23. A method of manufacturing a semiconductor device comprising the steps of:

disposing a conductive material on an insulating surface of a substrate;

forming an insulating film at least on said conductive material;

forming an amorphous semiconductor film on said insulating film;

providing said amorphous semiconductor film with a crystallization promoting material;

crystallizing said amorphous semiconductor film provided with said crystallization promoting material by a heat treatment; covering a selected portion of said semiconductor film with a mask;

introducing a gettering material into a semiconductor region not covered with said mask;

heating said semiconductor film so that said crystallization promoting material is gettered by said gettering material; and patterning said semiconductor film at least one active layer of a thin film transistor, wherein said active layer is formed so as not to be in contact with said region.

24. A method according to claim 23 wherein said conductive material comprises a silicide material.

25. A method according to claim 23 wherein said crystallization promoting material is one selected from the group consisting of Fe, Co, Ni, Ru, Rh, Pd, Os, Ir, Pt, Cu, and Au.

26. A method according to claim 23 wherein said amorphous semiconductor film comprises silicon or silicon germanium.

27. A method according to claim 23 wherein said gettering material is one selected from the group consisting of phosphorus, nitrogen, arsenic, antimony, and bismuth.

28. A method according to claim 23 wherein said gettering material is introduced into said semiconductor film by a plasma doping method.

29. A method according to claim 23 wherein said semiconductor device is an EL display device.

30. A method according to claim 23 wherein said semiconductor device is at least one selected from the group consisting of a portable information processing terminal, a head mount display, an electronic equipment having a function of displaying a map data, a portable telephone, a video camera, and a projector.

31. A method of manufacturing a semiconductor device comprising the steps of:

disposing a conductive material on an insulating surface of a substrate;

forming an insulating film at least on said conductive material;

forming an amorphous semiconductor film on said insulating film;

providing said amorphous semiconductor film with a crystallization promoting material;

crystallizing said amorphous semiconductor film provided with said crystallization promoting material by a heat treatment;

covering a selected portion of said semiconductor film with a mask;

introducing a gettering material into a semiconductor region not covered with said mask;

heating said semiconductor film so that said crystallization promoting material is gettered by said gettering material; and patterning said semiconductor film at least one active layer of a thin film transistor, wherein said patterning step is performed to remove at least said region.

32. A method according to claim 31 wherein said conductive material comprises a silicide material.

33. A method according to claim 31 wherein said crystallization promoting material is one selected from the group consisting of Fe, Co, Ni, Ru, Rh, Pd, Os, Ir, Pt, Cu, and Au.

34. A method according to claim 31 wherein said amorphous semiconductor film comprises silicon or silicon germanium.

35. A method according to claim 31 wherein said gettering material is one selected from the group consisting of phosphorus, nitrogen, arsenic, antimony, and bismuth.

36. A method according to claim 31 wherein said gettering material is introduced into said semiconductor film by a plasma doping method.

37. A method according to claim 31 wherein said semiconductor device is an EL display device.

38. A method according to claim 31 wherein said semiconductor device is at least one selected from the group consisting of a portable information processing terminal, a head mount display, an electronic equipment having a function of displaying a map data, a portable telephone, a video camera, and a projector.

39. A method of manufacturing an EL display device comprising the steps of:

disposing a conductive material on an insulating surface over a substrate;

forming an insulating film at least on said conductive material;

forming a semiconductor film on said insulating film;

providing said semiconductor film with a crystallization promoting material;

crystallizing said semiconductor film provided with said crystallization promoting material by a heat treatment;

covering a selected portion of said crystallized semiconductor film with a mask;

introducing a gettering material into a semiconductor region not covered with said mask; and heating said crystallized semiconductor film so that said crystallization promoting material is gettered by said gettering material.

40. A method according to claim 39 wherein said conductive material comprises a silicide material.

41. A method according to claim 39 wherein said crystallization promoting material is one selected from the group consisting of Fe, Co, Ni, Ru, Rh, Pd, Os, Ir, Pt, Cu, and Au.

42. A method according to claim 39 wherein said semiconductor film comprises silicon or silicon germanium.

43. A method according to claim 39 wherein said gettering material is one selected from the group consisting of phosphorus, nitrogen, arsenic, antimony, and bismuth.

44. A method according to claim 39 wherein said gettering material is introduced into said semiconductor film by a plasma doping method.

45. A method according to claim 39 wherein said EL display device is incorporated in at least one selected from the group consisting of a portable information processing terminal, a head mount display, an electronic equipment having a function of displaying a map data, a portable telephone, a video camera, and a projector.

46. A method of manufacturing an EL display device comprising the steps of:

forming a semiconductor film on an insulating surface over a substrate;

providing said semiconductor film with a crystallization promoting material;

crystallizing said semiconductor film provided with said crystallization promoting material by a heat treatment;

covering a selected portion of said crystallized semiconductor film with a mask;

introducing a gettering material into a semiconductor region not covered with said mask;

heating said crystallized semiconductor film so that said crystallization promoting material is gettered by said gettering material; and patterning said crystallized semiconductor film into at least one active layer of a thin film transistor, wherein said active layer is formed so as not to be in contact with said region.

47. A method according to claim 46 wherein said crystallization promoting material is one selected from the group consisting of Fe, Co, Ni, Ru, Rh, Pd, Os, Ir, Pt, Cu, and Au.

48. A method according to claim 46 wherein said semiconductor film comprises silicon or silicon germanium.

49. A method according to claim 46 wherein said gettering material is one selected from the group consisting of phosphorus, nitrogen, arsenic, antimony, and bismuth.

50. A method according to claim 46 wherein said gettering material is introduced into said semiconductor film by a plasma doping method.

51. A method according to claim 46 wherein said EL display device is incorporated in at least one selected from the group consisting of a portable information processing terminal, a head mount display, an electronic equipment having a function of displaying a map data, a portable telephone, a video camera, and a projector.

52. A method of manufacturing an EL display device comprising the steps of:

forming a semiconductor film on an insulating surface over a substrate;

providing said semiconductor film with a crystallization promoting material;

crystallizing said semiconductor film provided with said crystallization promoting material by a heat treatment;

covering a selected portion of said crystallized semiconductor film with a mask;

introducing a gettering material into a semiconductor region not covered with said mask;

heating said crystallized semiconductor film so that said crystallization promoting material is gettered by said gettering material; and patterning said crystallized semiconductor film into at least one active layer of a thin film transistor, wherein said patterning step is performed to remove at least said region.

53. A method according to claim 52 wherein said crystallization promoting material is one selected from the group consisting of Fe, Co, Ni, Ru, Rh, Pd, Os, Ir, Pt, Cu, and Au.

54. A method according to claim 52 wherein said semiconductor film comprises silicon or silicon germanium.

55. A method according to claim 52 wherein said gettering material is one selected from the group consisting of phosphorus, nitrogen, arsenic, antimony, and bismuth.

56. A method according to claim 52 wherein said gettering material is introduced into said semiconductor film by a plasma doping method.

57. A method according to claim 52 wherein said EL display device is incorporated in at least one selected from the group consisting of a portable information processing terminal, a head mount display, an electronic equipment having a function of displaying a map data, a portable telephone, a video camera, and a projector.

* * * * *